(12) United States Patent
Nagy et al.

(10) Patent No.: US 6,291,883 B1
(45) Date of Patent: Sep. 18, 2001

(54) STATIC RANDOM-ACCESS MEMORY DEVICE HAVING A LOCAL INTERCONNECT STRUCTURE

(75) Inventors: William J. Nagy; Kuo-Hua Lee, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/261,593

(22) Filed: Mar. 3, 1999

Related U.S. Application Data

(63) Continuation of application No. 08/866,593, filed on May 30, 1997, now abandoned.

(51) Int. Cl.[7] .................................................. H01L 23/48
(52) U.S. Cl. ........................ 257/734; 257/758; 257/903; 257/904
(58) Field of Search ................................ 257/903, 904, 257/734, 748, 774, 758

(56) References Cited

U.S. PATENT DOCUMENTS

| 4,657,628 | * | 4/1987 | Holloway et al. | 438/647 |
| 4,793,896 | * | 12/1988 | Douglas | 438/630 |
| 5,049,975 | * | 9/1991 | Ajika et al. | 257/764 |
| 5,317,187 | * | 5/1994 | Hindman et al. | 257/659 |
| 5,319,245 | * | 6/1994 | Chen et al. | 257/751 |
| 5,485,420 | * | 1/1996 | Lage et al. | 365/154 |
| 5,670,424 | * | 9/1997 | Chan et al. | 438/215 |
| 5,981,372 | | 11/1999 | Goto et al. | 438/621 |

FOREIGN PATENT DOCUMENTS

| 7-263544 | 10/1995 | (JP) . |
| 8-330314 | 12/1996 | (JP) . |

* cited by examiner

Primary Examiner—Eddie Lee
Assistant Examiner—George C. Eckert, II

(57) ABSTRACT

The present invention provides a static random-access memory (SRAM) device that comprises a substrate having an insulator and a gate formed thereover, where the insulator electrically insulates the gate from the substrate, and a local conductive layer that is formed on the gate structure and that extends from the gate and onto the substrate. The local conductive layer is connectable to a conductive interconnect structure to connect the gate electrically to an other portion of the SRAM device. The SRAM device, in one embodiment, is part of a complementary metal oxide semiconductor (CMOS). However, it will be appreciated by those who are of ordinary skill the art that the present invention may be used in various types of metal oxide semiconductors and similar semiconductor devices in general. Therefore, in an aspect of the present invention, there is provided a local conductive interconnect structure that provides a electrical path to which the gate may be electrically connected to other portions of the SRAM device without the need of multiple interconnect structures found in prior art devices. Thus, the overall cell size of the SRAM device may be substantially decreased such that it can be used in applications that require smaller cell sizes.

9 Claims, 3 Drawing Sheets

US 6,291,883 B1

STATIC RANDOM-ACCESS MEMORY DEVICE HAVING A LOCAL INTERCONNECT STRUCTURE

This is a continuation of U.S. patent application Ser. No. 08/866,593, filed on May 30, 1997, abandoned, entitled "A STATIC RANDOM-ACCESS MEMORY DEVICE HAVING A LOCAL INTERCONNECT STRUCTURE," to Kuo-Hua Lee, et al., which is incorporated herein by reference.

TECHNICAL FIELD OF THE INVENTION

The present invention is directed, in general, to a semiconductor device and, more specifically, to a semiconductor and a method of manufacture therefore wherein the semiconductor has a static random-access memory with a local conductive layer incorporated therein.

BACKGROUND OF THE INVENTION

Static random-access memory devices (SRAM) are well known and used extensively in semiconductor devices, such as complementary metal oxide semiconductors (CMOS). Static memories do not require periodic refresh signals in order to retain their stored data. The bit state in SRAM is stored in a pair of cross-coupled invertors, which form a circuit known as a flip-flop. The voltage on each of the two outputs of a flip-flop circuit is stable at only one of two possible voltage levels, because the operation of the circuit forces one output to a high potential, and the other to a low potential. The memory logic state of the cell is determined by whichever of the two inverter outputs is high. Flip-flops maintain a given state for as long as the circuit receives power, but they can be made to undergo a change in state (i.e., to flip), through the application of a trigger voltage of sufficient magnitude and duration to the appropriate input. Once the circuit has settled into its new stable state, the trigger voltage can be removed. SRAM cells can be implemented in NMOS, CMOS, bipolar or BICMOS technologies. For a more general background on this subject, see S. Wolf, *Silicon Processing for the VLSI Era,* Vols. I, II, and III, Latice Press, which are incorporated herein by reference.

The chief disadvantage of an SRAM cell is that it consists of at least six devices, as compared to only two for the dynamic-memory cell (DRAM). Thus, even when the same set of design rules is used, an SRAM chip cannot be built with as many cells as a DRAM chip in the same amount of area. One reason for the size of the SRAM is that separate openings or interconnect structures are used to connect to the silicon in the substrate and to the gate. Due to design rules, the interconnect structure must be a certain distance from the gate to prevent any possible short to the gate during the interconnects formation down to the silicon. These same design rules also cause the overall size of the SRAM cell to remain larger than desired.

On the other hand, SRAMs are the fastest semiconductor memories. Their speed is derived from the self-restoring nature of the flip-flop and the static peripheral circuits of the memory chip. Bipolar SRAMs are the fastest of all, and MOS SRAMs are the fastest among MOS memories.

Because of their speed, SRAMs use in devices that typically use DRAM cells is highly desirable. Unfortunately, however, it is also highly desirable to decrease the overall size of the device. Thus, conventionally designed SRAMs are often not used because the need for a smaller device outweighs the need for a faster device.

Accordingly, what is needed in the art is a device and method of manufacture thereof that provides a smaller SRAM cell. The device and method of the present invention address this need.

SUMMARY OF THE INVENTION

The present invention provides a static random-access memory (SRAM) device that comprises a substrate having a gate formed thereover, where the gate is insulated from the substrate, and a local conductive layer that is formed over the substrate and contacts an electrical structure within the SRAM device. The local conductive layer further contacts the gate to connect the gate electrically to the electrical structure. The SRAM device, in one embodiment, is part of a complementary metal oxide semiconductor (CMOS) or an N-channel metal oxide semiconductor (NMOS). However, it will be appreciated by those who are of ordinary skill in the art that the present invention may be used in various types of metal oxide semiconductors and various devices that employ those semiconductors.

The present invention therefore provides, in one embodiment, a local conductive interconnect structure that provides an electrical path to which the gate may be electrically connected to other portions of the SRAM device without the need of multiple interconnect structures found in prior art devices. Since an aspect of the present invention provides this option, the overall cell size of the SRAM device may be substantially decreased such that it can be used in applications that require smaller cell sizes.

In another embodiment, the local conductive layer is comprised of a conductive metal. For example, the local conductive layer may comprise a layer of titanium having a layer of titanium nitride formed over it that contacts the titanium layer. It will, of course, be apparent that other conductive materials that are used for fabricating such devices may be used in place of the titanium or titanium nitride. In those embodiments where the conductive layer is formed from titanium and titanium nitride, the titanium layer may be about 20 nm thick and the titanium nitride layer may have a thickness that ranges from about 60 nm to about 80 nm.

In one embodiment, the local conductive layer terminates on silicon, that is, the local conductive layer stops on an area that is in contact with the silicon substrate. In one advantageous embodiment, the local conductive layer terminates over the p-channel transistor.

In yet another embodiment, the SRAM device further comprises an oxide layer that is formed over and that contacts the local conductive layer. The oxide layer is patterned and etched such that it has common end edges with the local conductive layer.

In another embodiment, the local conductive layer is connected to the conductive interconnect structure by a single path. In one aspect of this particular embodiment, the single path is a conductive interconnect structure that includes an opening formed in a substrate dielectric layer that is formed over the gate. The opening has an interconnect conductive layer formed therein that contacts a portion of the local conductive layer to connect the local conductive layer electrically to the gate.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
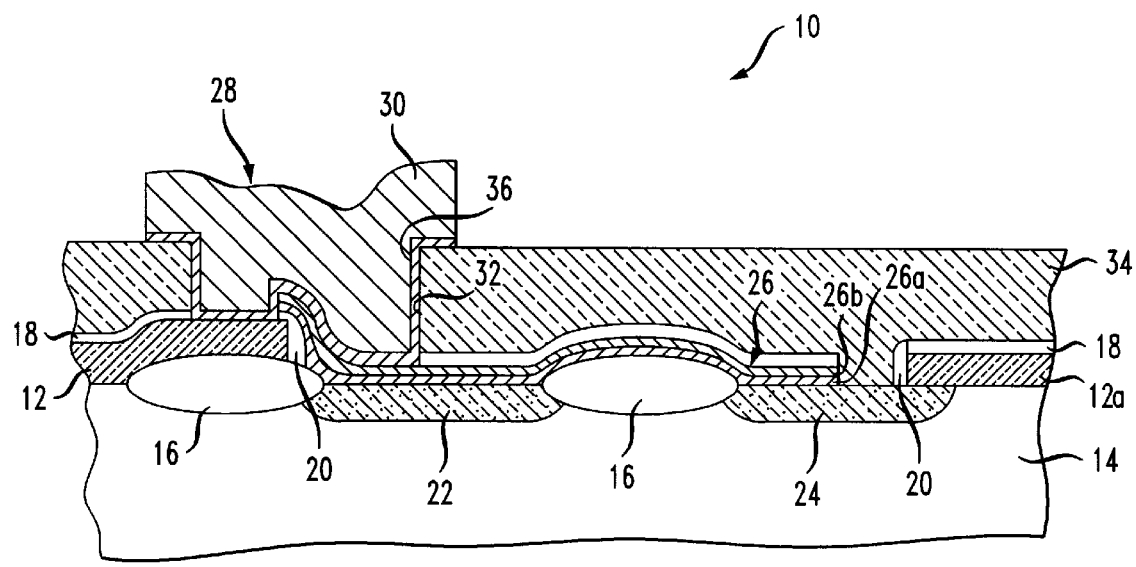
FIG. 1 illustrates a schematic cross-sectional diagram of a SRAM device constructed according to a method described herein.

In FIG. 1 there is illustrated a schematic cross-sectional diagram of a SRAM device 10 constructed according to a method described herein, which can be incorporated into a semiconductor device, such as a CMOS or NMOS that may be employed in various electronic devices. The SRAM device 10 includes a gate 12 that is formed over a substrate 14, which may be a p-type, n-type or other type of doped substrate known to those who are skilled in the art. The substrate 14 may also include conventionally formed field oxide regions 16. A portion of the gate 12 may be formed over one of the field oxide regions 16 as shown, while the remaining portion of the gate 12a may be formed over the substrate 14 as shown in the right-hand portion of FIG. 1. The portion of the gate 12a that is formed over the substrate 14 will typically be formed over a thin oxide region (not shown), which is often referred to as thin ox. The gate 12 is electrically insulated from the substrate 14 either by the field oxide region 16 or the thin oxide. A hardmask layer 18, such as an oxide layer, is formed over the gates 12,12a. In one advantageous embodiment, the gates 12,12a comprise a conductive material (e.g., doped polycrystalline silicon). The gate 12 may be heavily doped to be conductive, as in conventional MOS devices, and may be n-doped or p-doped either by diffusion, ion implantation, or by in-situ doping. Additionally, oxide spacers 20 are conventionally formed on either side of gate 12. The gate 12 is electrically connected to one or more electrical structures 22 and 24 in a manner that is discussed below. The electrical structures 22 and 24 may be various electrical structures that are typically found in SRAM devices, such as pull-up or pull-down regions, source or drain regions, a diode or resistor. However, in an illustrative embodiment, electrical structure 22 is a pull-up transistor and electrical structure 24 is a pull-down transistor. While FIG. 1 illustrates that the gate 12 is contacting both electrical structures 22 and 24, it should be understood that it may contact only one such structures when the design so requires. For example, the electrical structures 22,24 in FIG. 1 may be pull-up and pull-down regions, however, if the electrical structure was designed to be diode or resistor, only one such diode or resistor may be contacted by the local conductive layer 26.

Figure 1A:
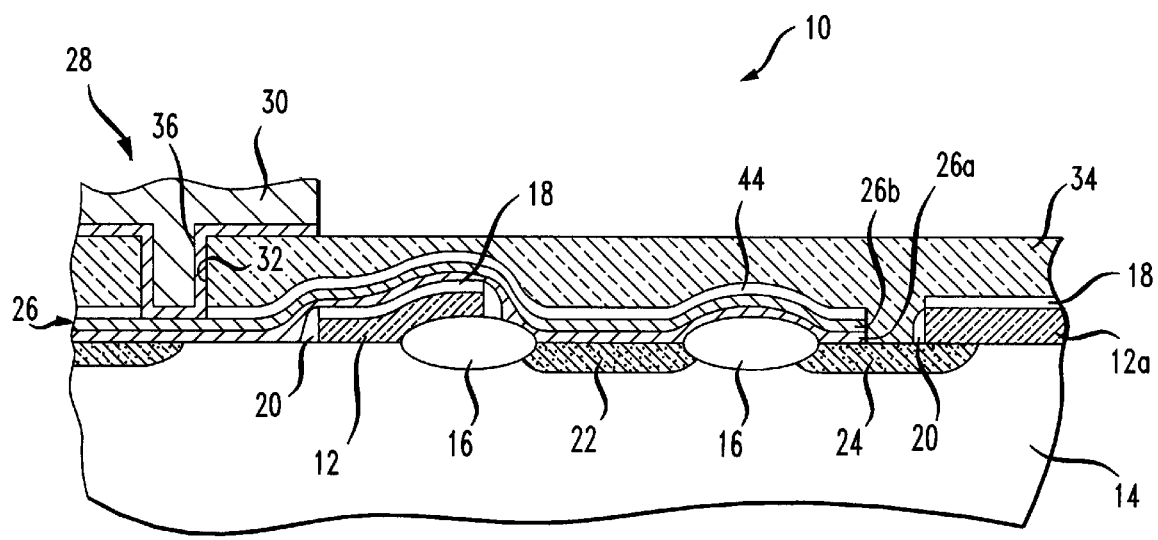
FIG. 1A illustrates a schematic cross-sectional diagram of an alternate embodiment of the SRAM device of FIG. 1.

Uniquely, the SRAM device 10 further includes a local conductive layer 26 that is formed over at least a portion of the substrate 14. The local conductive layer 26 may extend as far along the substrate 14 as design requires. In one embodiment, the conductive interconnect structure 28 contacts the local conductive layer 26, which in turn, contacts other substrate areas, as illustrated in FIG. 1A. However, in another embodiment, the local conductive layer 26 is connected to a conductive interconnect structure 28 that connects the gate 12 electrically to at least one of the electrical structures 22,24 through the local conductive layer 26, as illustrated in FIG. 1. The conductive interconnect structure 28 may form a portion of a subsequent metal level 30. Thus, the present invention provides in one embodiment, a local conductive layer 26 that provides a single electrical path through which the gate 12 may be electrically connected to an electrical structure within the SRAM device 10 without the need of multiple interconnect structures found in prior art devices. Since an aspect of the present invention provides this option, the overall cell size of the SRAM device 10 may be substantially decreased such that it can be used in applications that require smaller cell sizes.

In one embodiment, the single path is the conductive interconnect structure 28 that includes an opening 32 formed in a substrate dielectric layer 34 that is formed over the gate 12 and the local conductive layer 26. In one particular embodiment, the opening 32 has an interconnect conductive layer 36, such as titanium, formed therein that contacts a portion of the local conductive layer 26 and the gate 12, as illustrated in FIG. 1. In yet another aspect, the opening 32 may contact the local conductive layer 26, which in turn, contacts electrical structures 22,24, as illustrated in FIG. 1A. It should be noted that the interconnect structure 28 may be positioned anywhere on the local conductive layer 26, including positions that extend beyond the field oxide regions 16 and the gate 12. It should be further noted that other electrical path structures known to those who are skilled in the art may also be used in place of the above-discussed interconnect structure.

The local conductive layer 26 may be formed by conventional deposition processes (e.g., sputtering) from any metal suitable for conducting and holding an electric charge, such as aluminum, copper, silver, titanium, or noble metals such as gold, platinum, palladium, and the like. In a particular embodiment, however, local conductive layer 26 is a multilayered structure comprising a layer 26a of titanium (Ti) overlaid with a layer 26b of titanium nitride (TiN). The local conductive layer 26 may range in thickness from about 20 nm to about 80 nm, with the layer 26a having a thickness of about 20 nm, and the layer 26b ranging in thickness from about 60 nm to about 80 nm. In one embodiment, the local conductive layer 26 may extend over a portion of the substrate 14 and onto one of the field oxide regions 16, as illustrated in FIG. 1.

With a general description having been discussed, a method of fabricating the SRAM of the present invention will now be discussed with general reference to FIG. 2 through FIG. 5.

Figure 2:
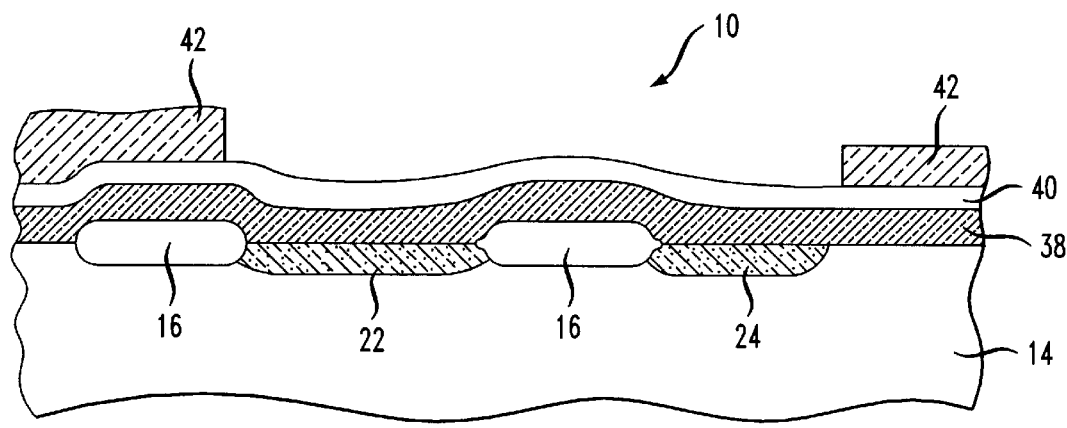
FIG. 2 illustrates a schematic cross-sectional diagram of the substrate after the deposition of the polysilicon material and the oxide layer and subsequent to the patterning of the photoresist material.

Turning first to FIG. 2, there is illustrated a schematic cross-sectional view of the a portion of the semiconductor device 10 in which the SRAM of the present invention may be used. The substrate 14 includes the field oxide regions 16 and the electrical structures 22,24 previously discussed with respect to FIG. 1. The gate material 38 that forms the gates is deposited using conventional materials and processes. The gate material 38 comprises a conductive material, for example a doped polycrystalline silicon material or other conductive material known to those who are of ordinary skill in the art. The gate material 38 may be heavily doped to be conductive, as in conventional MOS devices, and may be n-doped or p-doped either by diffusion, ion implantation, or by in-situ doping. Subsequent to the deposition of the gate material 38, an oxide material 40 is blanket deposited over the gate material 38. A photoresist material 42, is then patterned over the gate material 38 and the oxide material 40, which is typically formed from tetraethyl orthosiicate (TEOS). The gate material 38 and the oxide material 40 are then etched using conventional photolithographic processes. The oxide material 40, in one embodiment, is deposited to a thickness of about 30 nm.

Figure 3:
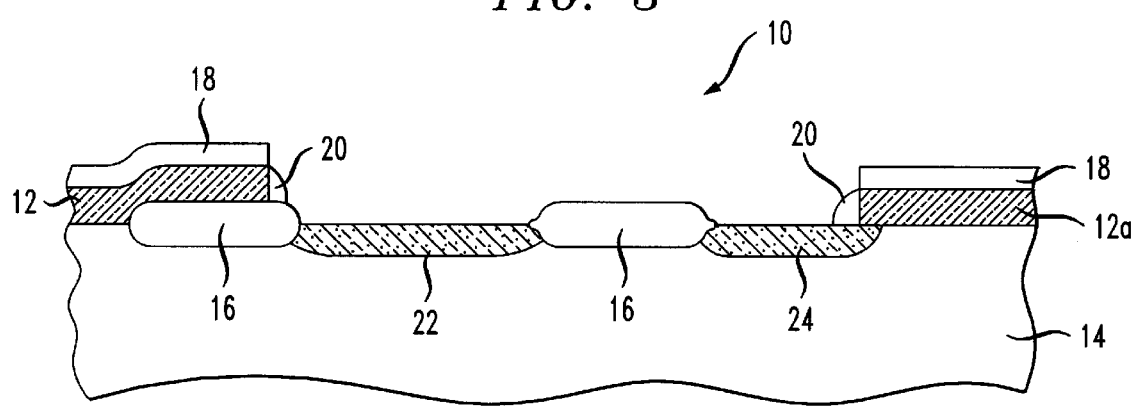
FIG. 3 illustrates a schematic cross-sectional diagram of a the device of FIG. 2 after the etching process and formation of the spacers, which defines the gate structures and overlying oxide layers.

Turning now to FIG. 3, the oxide spacers 20 are then conventionally formed on either side of gates 12,12a after their formation. During the etching process, much of the oxide material 40 (see FIG. 2) is removed, leaving the previously mentioned oxide layer 18. In an illustrative embodiment, the oxide layer 18 may have a thickness of about 3.0 nm. For clarity, the oxide layer 18 is the remnant of oxide material 40 (see FIG. 2) after the etching process. At this point, the gate 12 is not electrically connected to either of the electrical structures 22 or 24.

Figure 4:
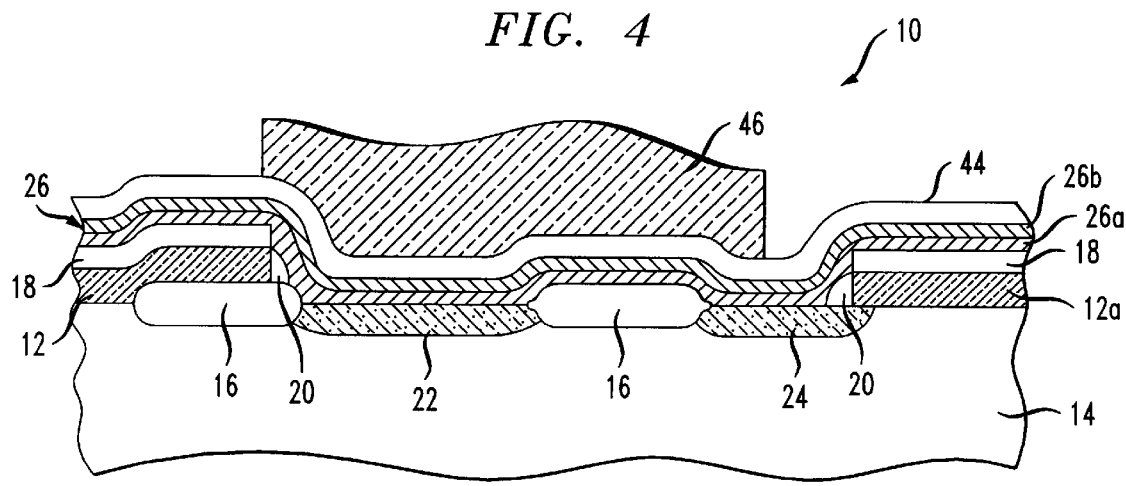
FIG. 4 illustrates a schematic cross-sectional diagram of the SRAM device of FIG. 3 subsequent to the formation of the local conductive layer and the overlying oxide layer on which the photoresist material has been patterned.
Figure 5:
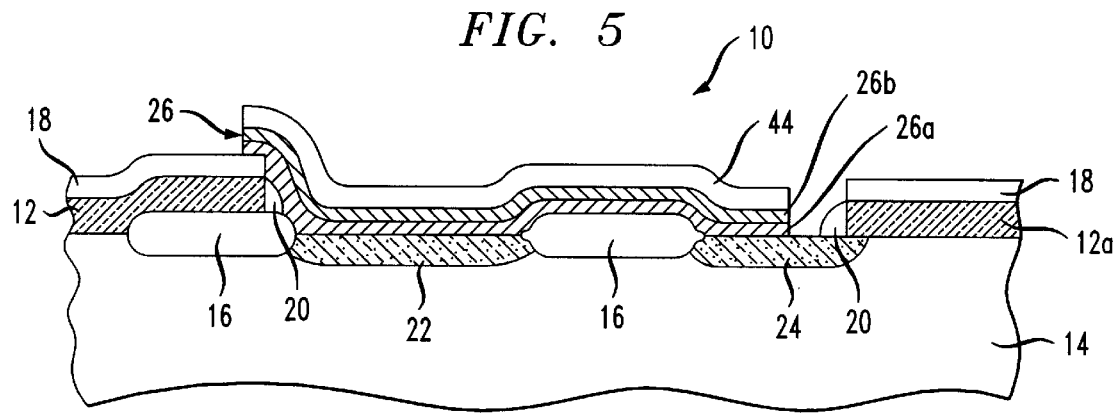
FIG. 5 illustrates a schematic cross-sectional diagram of the SRAM device of FIG. 4 subsequent etching process, which defines the local conductive layer and its overlying oxide layer.

Referring now to FIG. 4, the local conductive layer 26 is next deposited over the substrate 14, the gates 12,12a, the oxide layer 18 and the field oxide regions 16 using conventional deposition processes, such as physical vapor deposition (PVD) or sputtering. The local conductive layer 26 is blanket deposited over the entire semiconductor device 10, which allows extension of the local conductive layer 26 to portions of the semiconductor device 10 that are relatively distant to the gate 12, if design rules require. As discussed above, the local conductive layer 26 may be formed from any metal suitable for conducting and holding an electric charge, such as aluminum, copper, silver, titanium, or noble metals such as gold, platinum, palladium, and the like. In one embodiment, however, the local conductive layer 26 is a multilayered structure comprising a layer 26a of titanium (Ti) overlaid with a layer 26b of titanium nitride (TiN). In such embodiments, the titanium layer 26a is deposited by conventional deposition techniques to a thickness of about 20 nm, followed by the deposition of the titanium nitride layer 26b, which is deposited to a thickness that ranges from about from about 60 nm to about 80 nm. Following deposition of the local conductive layer 26, the device may optionally be subjected to a rapid thermal anneal process at temperatures of approximately 600° C. that causes the titanium to form a titanium silicide layer where the titanium contacts the substrate 14. The formation of the titanium silicide lowers the sheet resistance of the device.

After the local conductive layer 26 is deposited, another oxide layer 44 is blanket deposited over the local conductive layer 26. The purpose of this oxide layer is the same as that of oxide layer 18, which is formed over the gates 12,12a, and that is, these oxide layers serve to assist in controlling line size features and blocking future etches after the gates 12,12a are formed. The oxide layer 44 may be formed with conventional processes and materials. For example, it may be formed from a plasma-enhanced deposition of tetraethyl orthosilicate (TEOS) at around 375° C. However, other well known process and materials for forming an oxide may also be used. The thickness of the oxide layer 44 is set to prevent the titanium nitride layer 26b from being touched during subsequent etch processes. After the deposition of the oxide layer 44, a photo resist 46 is conventionally deposited and defined over the local conductive layer 26 and the oxide layer 44, as illustrated. In one embodiment, the photo resist 46 is defined such that the local conductive layer 26 and the oxide layer 44 extend over a small portion of the gate 12 as illustrated in FIG. 4. In one advantageous embodiment, a dry etch (e.g., trifluro methane ($CHF_3$) or carbon tetraflouride ($CF_4$))/wet etch (e.g., hydrofloric acid, HF), is then performed, which results in the structure shown in FIG. 5.

Figure 6:
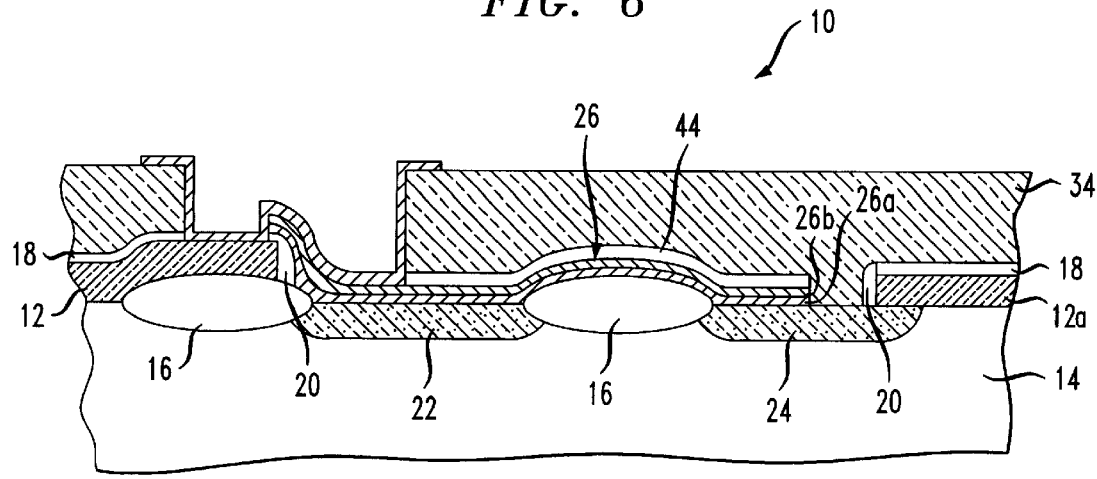
FIG. 6 illustrates a schematic cross-sectional diagram of the SRAM device of FIG. 5 subsequent to the formation of the deposition of the dielectric, the formation of the opening, the deposition of its conductive layer and just prior to the deposition of the interconnect metal.

Turning now to FIG. 6, following the formation and patterning of the local conductive layer 26, the substrate dielectric layer 34 may then be deposited over the local conductive layer 26, the gate 12 and the substrate 14 by conventional deposition processes. The substrate dielectric layer 34 may comprise any type of material used for insulating purposes in the manufacture of semiconductor devices. However, in one particular embodiment, the substrate dielectric layer 34 is deposited by chemical vapor deposition ("CVD")from a silicon-based material, such as TEOS to yield a deposited silicon dioxide dielectric layer. In those embodiments where the opening 32 is present, the substrate dielectric layer 34 is then patterned and etched using conventional processes to form the opening 32 over the local conductive layer 26 and the gate 12. In one particular embodiment, the interconnect conductive layer 36 is then formed within the opening 32 by conventional processes such that it contacts a portion of the local conductive layer 26. As stated above, the opening 32 may be formed anywhere along the local conductive layer 26. The interconnect metal 30 (see FIG. 1) is then deposited in the opening 32 to provide electrical connection to other portions of the semiconductor or SRAM device. As seen from one embodiment illustrated in FIGS. 1 and 6, the conductive interconnect structure 28 contacts the gate 12 and the local interconnect structure 26 to connect the gate 12 electrically to the electrical structures 22,24 by way of the local interconnect structure 26.

From the foregoing, the present invention provides a static random-access memory (SRAM) device that comprises a substrate having a gate formed thereover that is insulated electrically from the substrate, and a local conductive layer that is formed on the the substrate. The local conductive layer electrically connects the gate to electrical structures within the SRAM device. The SRAM device, in one embodiment, is part of a complementary metal oxide semiconductor (CMOS). In an aspect of the present invention, a local conductive interconnect structure provides an electrical path to which the gate may be electrically connected to other portions of the SRAM device without the need of multiple interconnect structures found in prior art devices. Since an aspect of the present invention provides this option, the overall cell size of the SRAM device may be substantially decreased such that it can be used in applications that require smaller cell sizes.

The foregoing has outlined, rather broadly, preferred and alternative features of the present invention so that those who are skilled in the art may better understand the detailed description of the invention that follows. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

What is claimed is:

1. A static random-access memory (SRAM) device, comprising:
    a substrate having a gate formed thereon and an active structure formed therein, said gate electrically insulated from said substrate; and a local conductive layer having a first end that contacts and terminates directly on said active structure;

a single path conductive interconnect structure that includes an opening formed in a substrate dielectric layer formed over said gate, said opening having an interconnect conductive layer formed therein that contacts a portion of said local conductive layer to connect said local conductive layer electrically to said gate.

2. The SRAM device as recited in claim 1 wherein said local conductive layer is comprised of a conductive metal.

3. The SRAM device as recited in claim 1 wherein said local conductive layer is comprised of a layer of titanium having a layer of titanium nitride formed over and contacting said titanium layer.

4. The SRAM device as recited in claim 3 wherein a thickness of said titanium layer is about 20 nm.

5. The SRAM device as recited in claim 3 wherein a thickness of said titanium nitride layer ranges from about 60 nm to about 80 nm.

6. The SRAM device as recited in claim 1 wherein said local conductive layer terminates on silicon.

7. The SRAM device as recited in claim 1 further comprising an oxide layer formed over and contacting said local conductive layer.

8. The SRAM device as recited in claim 1 wherein said SRAM device includes a portion of a complementary metal oxide semiconductor.

9. The SRAM device as recited in claim 1 wherein said SRAM device includes a portion of an N-channel metal oxide semiconductor.

* * * * *